Jan. 9, 1973 R. NUTTALL 3,709,726
SEMICONDUCTOR DEVICES
Filed Jan. 6, 1970
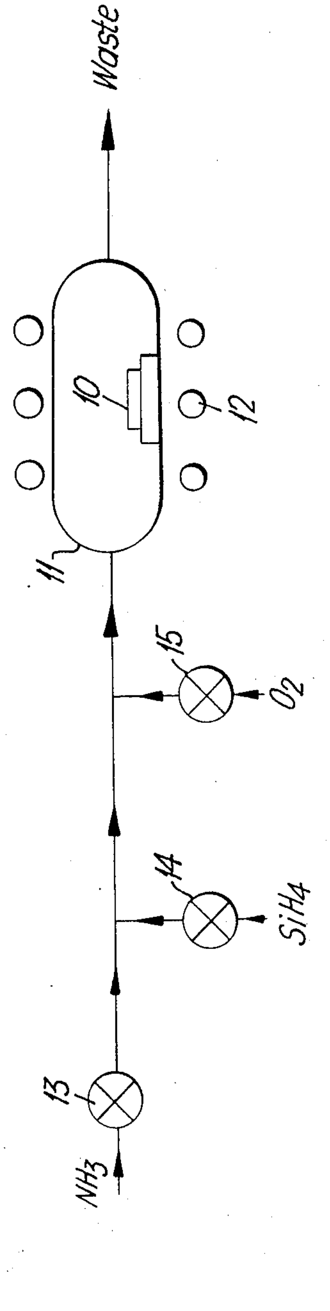
Inventor
Roy Nuttall
By Cameron, Kerkam & Sutton, Attorneys

United States Patent Office 3,709,726
Patented Jan. 9, 1973

3,709,726

SEMICONDUCTOR DEVICES

Roy Nuttall, Cheadle, England, assignor to Ferranti, Limited, Hollinwood, Lancashire, England Filed Jan. 6, 1970, Ser. No. 919
Claims priority, application Great Britain, Jan. 9, 1969, 1,454/69
Int. Cl. C23c *11/00*
U.S. Cl. 117—201 7 Claims

ABSTRACT OF THE DISCLOSURE

A pyrolysis method of producing an electrically-insulating layer of silicon oxynitride on a semiconductor device includes the step of heating the device in an atmosphere containing ammonia, silane and oxygen at a temperature between 300° C. and 600° C.

This invention relates to semiconductor devices of the type which incorporate one or more layers of electrically insulating silicon oxynitride.

Electrically insulating layers are used in semi-conductor devices and their manufacture for a variety of reasons. For example, in the case of a planar device it is known to use such a layer to protect the p–n junction, and insulating layers are also used in MOS and field-effect devices. Integrated circuits also make considerable use of insulating layers to form masks for diffusion or deposition, for crossover insulation and for final passivation of the integrated circuit.

It is common practice to use silicon dioxide for these purposes, though it suffers from several disadvantages. Various other materials have been used such as silicon nitride, a layer of silicon dioxide covered by a layer of silicon nitride or the material commonly referred to as silicon oxynitride. This latter material is a compound of silicon, oxygen and nitrogen and may be considered as a mixture of silicon dioxide and silicon nitride in which the proportions of oxygen and nitrogen may be varied. As is well known both silicon dioxide and silicon nitride used alone have considerable disadvantages due to undesirable properties of these materials. The use of a silicon dioxide/silicon nitride "sandwich" overcomes the majority of these disadvantages, but necessarily involves the separate deposition of two layers. For this reason the use of silicon oxynitride is advantageous, since only a single layer is required.

It is known to use silicon oxynitride layers for the purposes stated above. For example, U.S. Pat. 3,422,321 is concerned with a pyrolysis method of forming such a material, therein referred to as "oxygenated silicon nitride," on a semiconductor device. The main problem is caused by the temperatures necessary for such a process, the range 600° C. to 1000° C. being referred to in the abovementioned patent. The use of such temperatures often causes damage to the semiconductor device or the insulating layer due to the thermal cycling and possible differences in thermal expansion coefficient.

It is an object of the invention to provide a method of formation of a layer of silicon oxynitride on a semiconductor device which avoids these problems.

According to the present invention there is provided a method of manufacture of a semiconductor device which includes the step of producing an electrically-insulating layer of silicon oxynitride on a semiconductor body by heating the body to a temperature in the range from 300° C. to 600° C. in an atmosphere containing ammonia silane and oxygen, the ammonia being present in excess.

Preferably, the method of manufacture includes using a ratio by volume of oxygen to silane within the range 0.5 to 5.

Also according to the invention there is provided a semiconductor device which includes an electrically insulating layer of silicon oxynitride produced by heating a semiconductor body to a temperature in the range from 300° C. to 600° C. in an atmosphere containing ammonia, silane and oxygen, the ammonia being present in excess.

Preferably, the ratio by volume of oxygen to silane is within the range 0.5 to 5.

The electrical properties and the dimensions of the insulating layer depend to a large extent upon the function which the layer is to perform. For example the properties of the material used for diffusion masks are such that the same material is not entirely suitable for the insulating layers of MOS devices. It is for this reason that a range of reaction temperatures and gas mixture compositions is specified. One particularly useful form of the insulating material is that which has a coefficient of thermal expansion substantially the same as that of the semiconductor body. Such a layer is useful for the insulation of crossovers in integrated circuit manufacture.

The method of producing a layer of electrically insulating silicon oxynitride according to the invention is illustrated in the drawing and involves passing a stream of a mixture of gases over a heated semiconductor body or substrate. The substrate 10 is mounted on a pedestal in a reaction vessel 11 and heated to a temperature in the range from 300° C. to 600° C. by means of a RF heating coil 12. The various constituents of the gas mixture are supplied through separate valves 13, 14 and 15 and flowmeters (not shown) so that the flow rate may be controlled. The main constituent of the gas mixture is ammonia, which is present both as a carrier for the other gases and as one of the constituents of the reaction which takes place. The other two gases, oxygen and silane, are present in very much smaller quantities, though the ratio by volume of oxygen to silane may be varied within the range 0.5 to 5 to vary the proportion of oxide and nitride in the oxynitride layer.

As a typical example, with a silcon substrate heated to 450° C. the gas mixture comprised ammonia at flow rate of 5 litres/minute, oxygen at 25 millilitres/minute and silane at 6 millilitres/minute. The silicon oxynitride layer so produced has a coefficient of thermal expansion very similar to that of the silicon substrate, and is hence ideally suited for use as crossover insulation on such a substrate.

The material produced by the above process is, in effect, a homogeneous mixture of silicon dioxide and silicon nitride. Such a material has been given several names such as silicon oxynitride and oxygenated silicon nitride. The relatively proportions of oxide and nitride may be varied by varying the composition of the gas mixture as stated above. The example quoted above results in a layer which has been found to comprise, approximately, 7 mole percent of the nitride and 93 mole percent of the oxide.

The low reaction temperatures go a long way towards avoiding the type of damage, due largely to cracking, which has been encountered previously. The properties of the layers produced compare favourably with those produced at higher reaction temperatures, although it had previously been thought that a material of this type could not be produced satisfactorily below about 600° C.

What is claimed is:

1. A method of manufacture of a semiconductor device which includes the step of producing an electrically-insulating layer of silicon oxynitride on a semiconductor body by heating the body to a temperature in the range from 300° C. to 600° C. in an atmosphere containing ammonia, silane and oxygen, the ammonia being the main constituent of the gas mixture and being present in excess.

2. A method as claimed in claim 1 in which the ratio by volume of oxygen to silane lies within the range 0.5 to 5.

3. A method as claimed in claim 1 in which the semiconductor body is of silicon, the flow rate of ammonia is 5 litres per minute, and the flow rate of silane is 6 millilitres per minute, the reaction temperature being 450° C.

4. A method of manufacture of a semiconductor device comprising the steps of placing the semiconductor body in a reactor chamber, heating the body to a temperature in the range from 300° C. to 600° C. and simultaneously passing over said body a stream of a mixture of gasses over the heated semiconductor body containing ammonia, silane and oxygen, the ammonia being the main constituent of the gas mixture and being present in excess and the ratio by volume of oxygen to silane being within the range of 0.5 to 5 to thereby deposit on said body an electrically insulating layer of silicon oxynitride.

5. A method of depositing silicon oxynitride as set forth in claim 4 wherein the flow rate of ammonia is 5 litres per minute.

6. A method as set forth in claim 5 wherein the temperature of the semiconductor body is maintained at approximately 450° C.

7. A method of manufacture as set forth in claim 2 wherein the body is maintained at a temperature of approximately 450° C.

References Cited

UNITED STATES PATENTS

| | | | |
|---|---|---|---|
| 3,019,137 | 1/1962 | Hanlet | 117—106 X |
| 3,485,666 | 12/1969 | Sterling et al. | 117—106 X |
| 3,422,321 | 1/1969 | Tombs | 317—235 A |

FOREIGN PATENTS

| | | | |
|---|---|---|---|
| 1,227,851 | 4/1971 | Great Britain. | 117—201 |

RALPH S. KENDALL, Primary Examiner

U.S. Cl. X.R.

117—106 A, DIG. 12